United States Patent
Trezza et al.

(10) Patent No.: US 6,423,560 B1
(45) Date of Patent: Jul. 23, 2002

(54) METHOD OF MAKING AN OPTOELECTRONIC DEVICE USING MULTIPLE ETCH STOP LAYERS

(75) Inventors: John A. Trezza, Nashua; Gregory K. Duddoff, Amherst, both of NH (US)

(73) Assignee: Teraconnect, Incoporated, Nashua, NH (US)

(*) Notice: Subject to any disclaimer, the term of this patent is extended or adjusted under 35 U.S.C. 154(b) by 40 days.

(21) Appl. No.: 09/693,383

(22) Filed: Oct. 20, 2000

Related U.S. Application Data

(60) Provisional application No. 60/161,171, filed on Oct. 22, 1999.

(51) Int. Cl.⁷ .............................. H01L 21/56
(52) U.S. Cl. .................. 438/25; 438/28; 438/59; 438/67
(58) Field of Search .................... 438/25, 28, 108, 438/FOR 136, FOR 139, FOR 369, 59, 67

(56) References Cited

U.S. PATENT DOCUMENTS

| | | | |
|---|---|---|---|
| 5,385,632 A | * | 1/1995 | Goossen ..................... 438/108 |
| 5,496,743 A | | 3/1996 | Luryi |
| 5,578,162 A | * | 11/1996 | D'Asaro et al. ........... 148/33.4 |
| 5,627,100 A | | 5/1997 | Manurel et al. |
| 5,639,343 A | | 6/1997 | Dobkin |
| 5,821,160 A | | 10/1998 | Rodrigues et al. |
| 5,858,814 A | | 1/1999 | Goossen et al. |
| 5,978,401 A | | 11/1999 | Morgan |
| 5,996,221 A | | 12/1999 | Chirovsky |
| 6,136,623 A | * | 10/2000 | Hofstetter et al. ............. 372/50 |

OTHER PUBLICATIONS

PCT International Search Report dated Apr. 27, 2001 of International Application No. PCT/US00/24134 filed Oct. 20, 2001.
Greig, W.J., Bendat, S., Saba, V.R., Flip Chip Technology: Achieving precise Placement and Attachment (date unknown).
M. Ajmone Marsan et al, Modelling Slotted Multi–Channel Ring All–Optical Networks, *IEEE*, 1997, p. 146–153.
Marco Ajmone Marsan et al, Access Protocols for Photonic WDM Multi–Rings with Tunable Transmitters and Fixed Receivers, *SPIE*, pp. 59–72, vol. 26921, 1996.
Carl Beckmann, Applications: Asynchronous Transfer Mode and Synchronous Optical Network, *Handbook of FIber Optic Data Communication*, 1998, pp. 385–414, Academic Press.
Floyd E. Ross, An Overview of FDDI: The Fiber Distributed Data Interface, *IEEE Journal on Selected Areas in Communications*, Sep. 1989, pp. 1043–1051, vol. 7 No. 7.

* cited by examiner

Primary Examiner—George Fourson
(74) Attorney, Agent, or Firm—Scott J. Amus; Vernon C. Maine; Maine & Asmus

(57) ABSTRACT

This invention provides a method for making interdigitated optoelectronic devices in which the surfaces of the photonic devices, emitters and detectors, are protected from contaminants during processing through the use of multiple etch stop layers.

7 Claims, 4 Drawing Sheets

METHOD OF MAKING AN OPTOELECTRONIC DEVICE USING MULTIPLE ETCH STOP LAYERS

RELATED APPLICATIONS

This application is based on Provisional Patent Application Serial No. 60/161,171 filed Oct. 22, 1999.

FIELD OF THE INVENTION

This invention relates to optical communication systems and more particularly to an optical transceiver array.

BACKGROUND OF THE INVENTION

Optical couplers are now used to communicate optical signals over short and long distances between, for example, two computers, two circuit boards in one computer, and even two different chips on the same circuit board.

In response, integrated circuit technology that enables bi-directional, high-speed optical rather than electrical interconnections has been developed. This technology allows laser emitters and detectors to be integrated onto a semiconductor substrate, making electrical connection with electronic circuitry previously built on that substrate.

Thus, optical rather than electrical communications between electronic devices is accomplished. An optical transmitter-receiver module typically includes both light emitting devices such as vertical cavity surface emitting lasers (VCSELS) and light detecting devices such as photodiodes. Such a module may include separate chips, or more typically, the VCSELS and the photodiodes are grown on the same substrate. See U.S. Pat. No. 5,978,401 incorporated herein by this reference.

Driver-receiver circuitry modules, typically in the form of ASIC chips, include driver circuitry which receives electrical signals from one electronic device and which, in response, drives the VCSELS accordingly. The ASIC also include receiver circuitry for receiving signals from the photodiodes and, in response, which processes those electrical signals providing an appropriate output to the associated electronic device.

The combination of the VCSELS and the photodiodes and the ASIC circuitry is typically called an optical transceiver. One way to hybridize the VCSELS and the photodiodes and the ASIC receiver circuitry is by "flip-chip bonding." See U.S. Pat. No. 5,858,814, incorporated herein by this reference.

However, one problem that occurs during the manufacture of such transceiver arrays is the presence of contaminants on the surfaces of the photonic devices throughout the manufacturing process. The presence of such contaminants may reduce the optical transfer efficiency or even result in failure of a photonic device to transmit or receive light entirely.

SUMMARY OF THE INVENTION

It is therefore an object of this invention to provide an improved method of integration of integrated circuits.

It is a further object of this invention to provide such an improved method which reduces or eliminates contamination of the surfaces of the photonic devices.

This invention results from the realization that a more optically efficient interdigitated transceiver array is achieved from the use of multiple etch stop layers to provide optically clean surfaces on all of the photonic devices.

The present invention provides a method of making a hybrid interdigitated device while protecting the surfaces of the photonic devices. The primary steps are hybridizing first and second substrates, the second substrate including at least one first type photonic device, the epitaxial layer construction of the first type photonic device including at least first and second sacrificial layers. A first flowable hardenable material is applied to join the first and second substrates, then the material is cured. The second substrate is removed as is the sacrificial device and the first sacrificial layer. Then a third substrate is hybridized with the first substrate, the third substrate including at least one second type photonic device and at least a third sacrificial layer in the epitaxial layer construction. The method also includes introducing a second flowable hardenable material to join the first and third substrates; curing the second flowable hardenable material; removing the third substrate as well as the second and third sacrificial layers.

The first substrate may be a silicon CMOS substrate. The second and third substrates may be chosen from the III-V group of materials and are preferably GaAs. The sacrificial layers may be AlGaAs with a 30% Al content.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
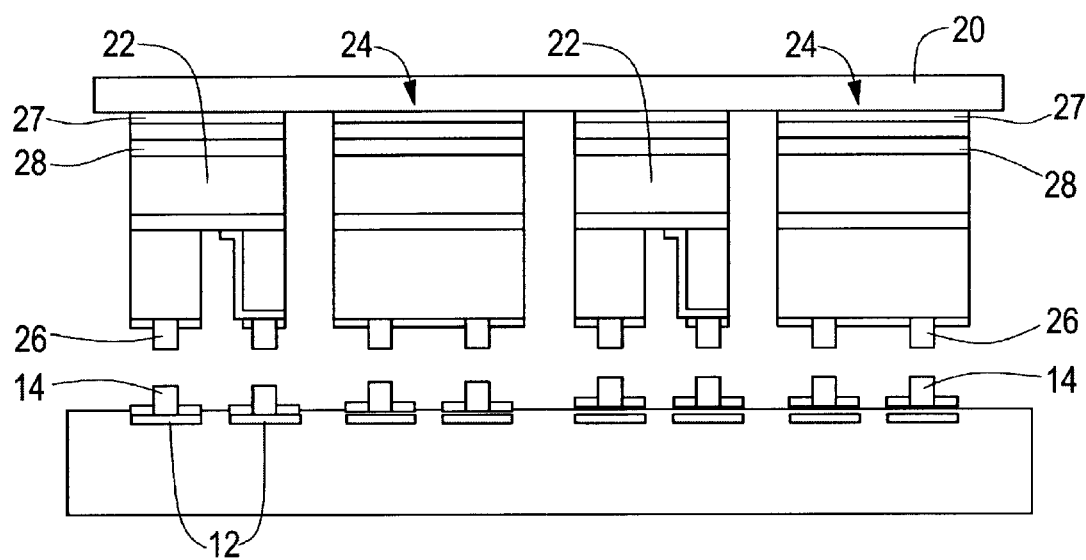
FIG. 1 is a schematic side elevational view of first and second substrates to be hybridized according to this invention.

As shown in FIG. 1, silicon substrate 10, with driver circuitry (not shown), has metal bonding pads 12 and solder bumps 14 formed on one surface thereof. GaAs substrate 20 has emitters 22 and sacrificial devices 24 grown epitaxially on one surface thereof. Emitters 22 and sacrificial devices 24 also have solder bumps 26 formed thereon which align with solder bumps 14 on silicon substrate 10. Emitters 22 are identical, having been grown on the same GaAs substrate with the same layer construction and include first etch stop layer 27 and second etch stop layer 28. Similarly, sacrificial devices 24 have the same layer construction.

GaAs substrate 20 and silicon substrate 10 are pressed together such that the surfaces of solder bumps 14 interlock with the corresponding solder bumps 26, thereby developing a low electrical resistance, mechanically stable connection in each aligned solder bump pair. This process is also referred to as "hybridizing" or "flip-chip bonding."

After the hybridizing step is complete, a flowable hardenable material 30 (FIG. 2), such as an epoxy resin, is introduced into the spaces between and around emitters 22 and sacrificial devices 24. Flowable hardenable material 30 provides physical stability for emitters 22 during subsequent processing steps. Once flowable hardenable material 30 is introduced, it is cured as appropriate, such as by exposure to UV light if a UV-curable epoxy resin is used.

Figure 2:
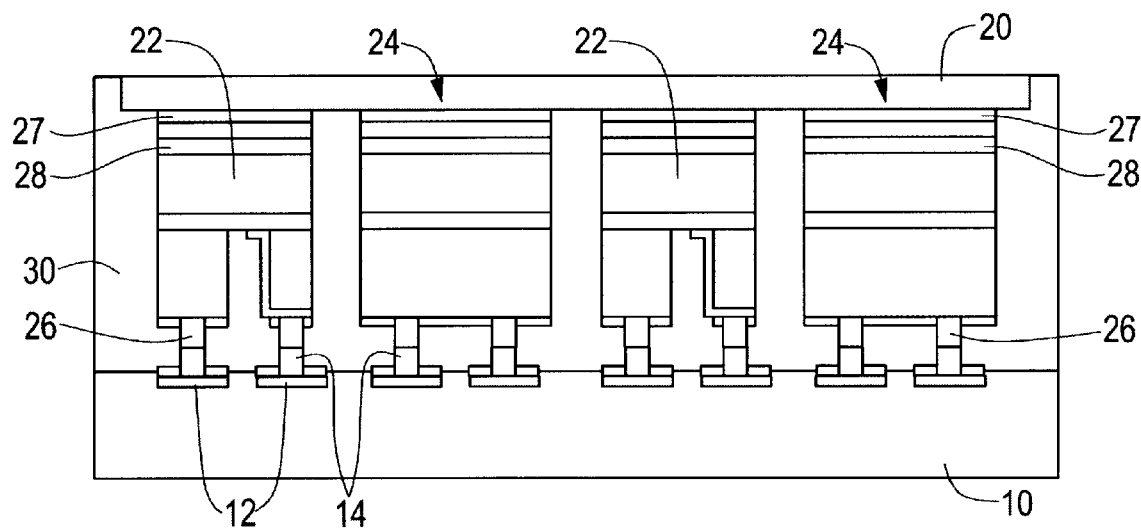
FIG. 2 is a schematic side elevational view of the hybridized first and second substrates with the first flowable hardenable material introduced.

Next, substrate 20 is removed. The bulk of substrate 20 is removed using a mechanical lapping process or other suitable mechanical process, as shown in FIG. 2. Preferably, the thickness of substrate 20 remaining after the mechanical lapping process is complete is in the range of 10 to 50 microns.

Figure 3:
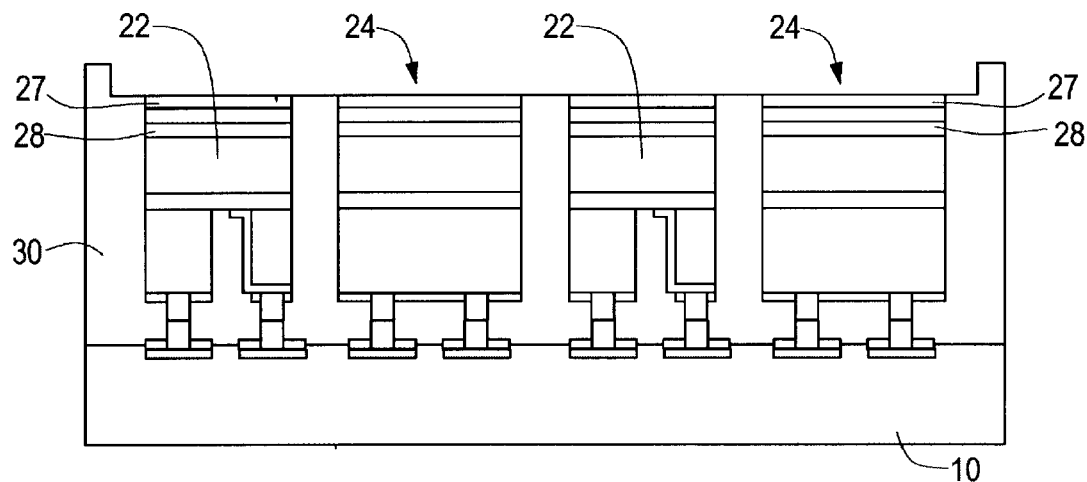
FIG. 3 is a schematic side elevational view of the assembly after removal of the second substrate.

A selective dry chemical etch is used to remove the rest of substrate 20 as shown in FIG. 3. Various dry etch formulations enable selective removal of semiconductor material. For example, to remove a GaAs substrate, a dry etch composition consisting of $SF_6/SiCl_4$ may be used. The dry etch process is complete when first etch stop layer 27 is reached. Etch stop layer 27 is composed of material, such as AlGaAs, which is not susceptible to dry etching by the dry etch composition used to remove substrate 20. A AlGaAs composition of about 30% Al is used in a preferred embodiment.

Figure 4:
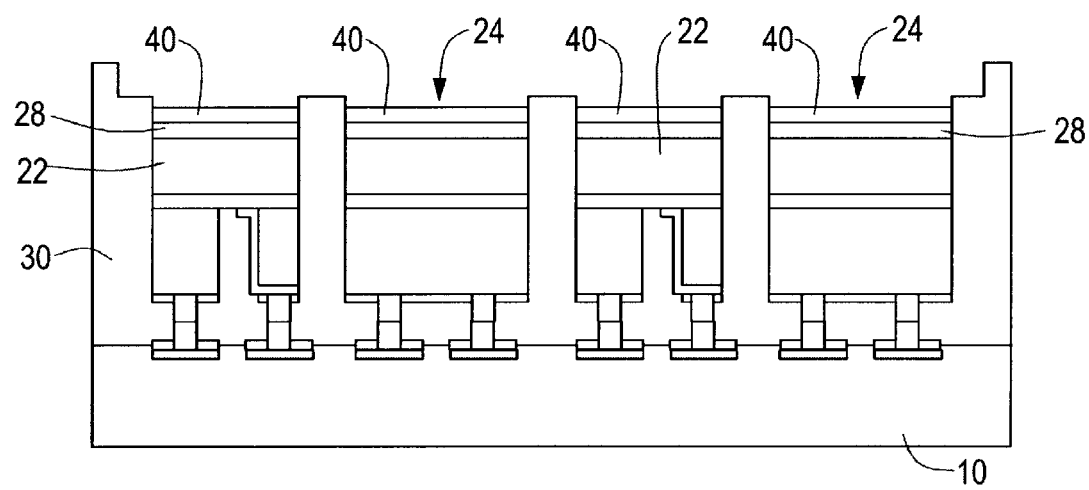
FIG. 4 is a schematic side elevational view of the assembly after removal of the first etch stop layers.

A wet etch step is used to remove etch stop 27, as shown in FIG. 4. Again, the dry etch composition selected removes only etch stop layer 27, leaving GaAs layer 40 exposed.

Figure 5:
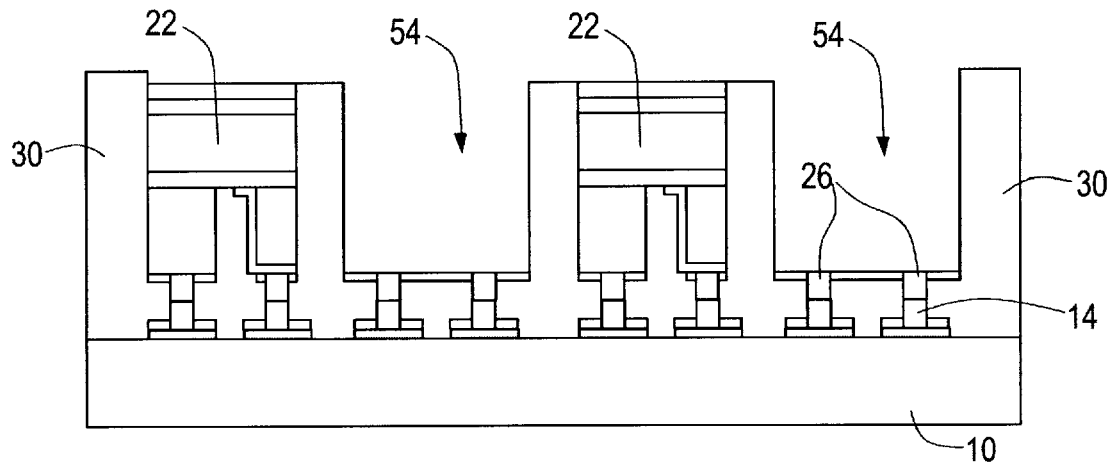
FIG. 5 is a schematic side elevational view of the assembly after removal of the sacrificial devices.

To remove the sacrificial devices 24, photolithographic masking and chemical etching processes are typically performed. This chemical etch does not remove solder bumps 26 or epoxy 30, as shown in FIG. 5. Typical compositions for the chemical etch would include $SF_6/SiCl_4$. After removal of sacrificial devices 24, gaps 54, FIG. 5, are left.

Figure 6:
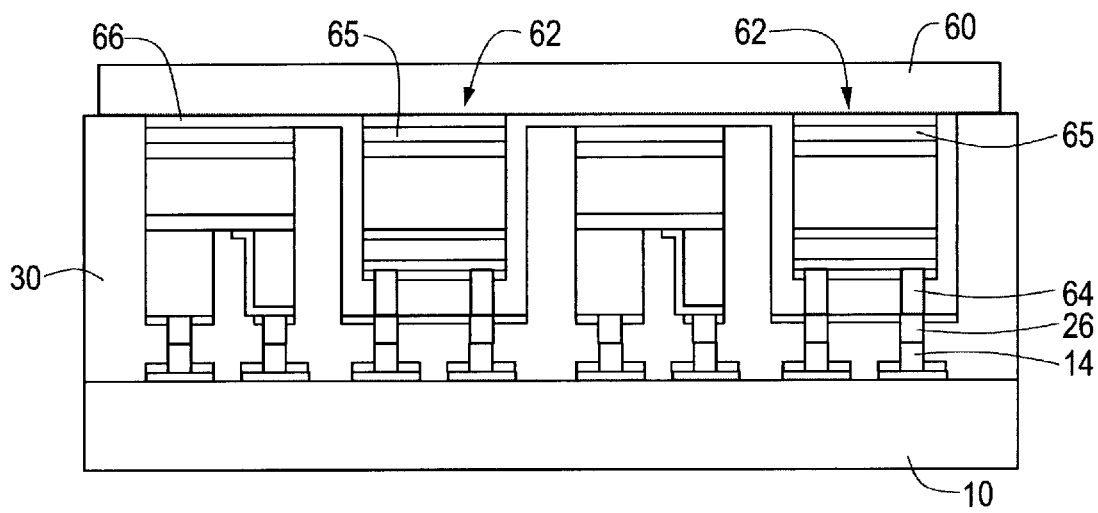
FIG. 6 is a schematic side elevational view of the assembly with the third substrate hybridized and the second flowable hardenable material introduced.

FIG. 6 shows GaAs substrate 60 with photonic devices 62 grown thereupon. Photonic devices 62 are typically detectors or photodiodes. Photonic devices 62 have the same layer construction, including third etch stop layer 65. Substrate 60 is pressed together with substrate 10 such that photonic devices 62 are inserted in gaps 54 and solder bumps 64 interlock with solder bumps 14 and 26 to form a good electrical and mechanical contact.

Flowable hardenable material 66 is then introduced in the spaces between and around detectors 62 and flowable hardenable material 30. Flowable hardenable materials 30 and 66 may be the same composition or may differ in composition. Flowable hardenable material 66 is then cured by appropriate means once it is introduced, as for example, by UV light if a UV-curable epoxy is used. After curing, flowable hardenable material 66 provides mechanical stability for detectors 62.

Figure 7:
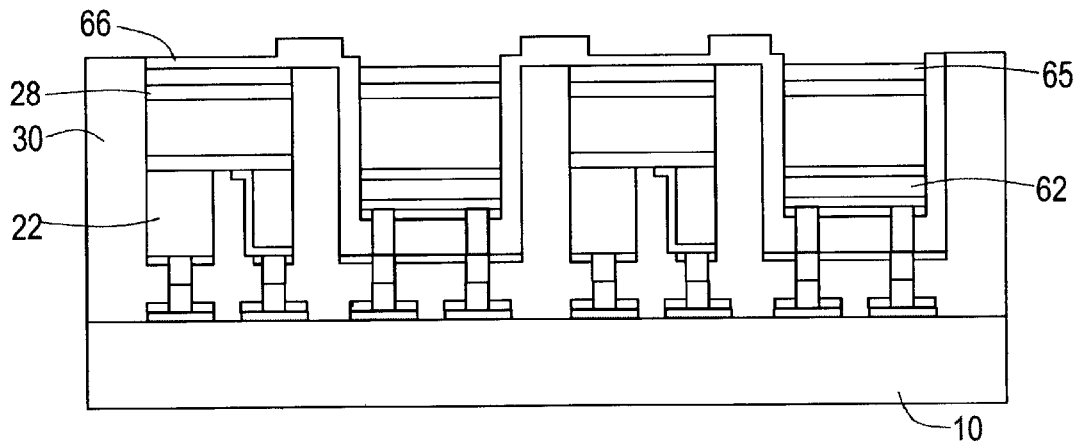
FIG. 7 is a schematic side elevational view of the assembly with the third substrate removed.

A mechanical process, such as lapping, is used to reduce the thickness of substrate 60 to a range of about 30 to 50 microns. A selective dry chemical etch is then used to remove the rest of substrate 60 as shown in FIG. 7. Etch stop layer 65 prevents the dry chemical etch advancing beyond that layer.

Figure 8:
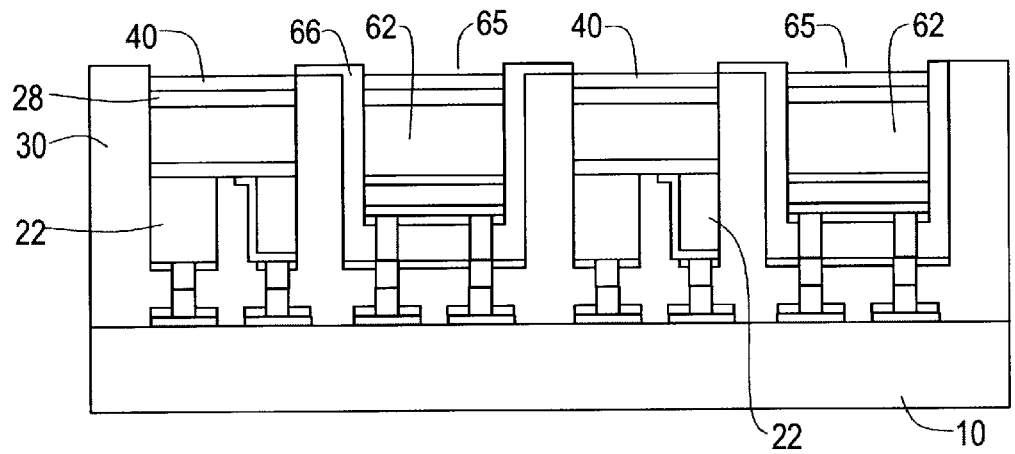
FIG. 8 is a schematic side elevational view of the assembly with the substrate's second etch stop and substrate's third etch stop layers exposed.

A second photolithographic masking and etching is performed to remove epoxy 66 from above emitters 22 as shown in FIG. 8.

Figure 9:
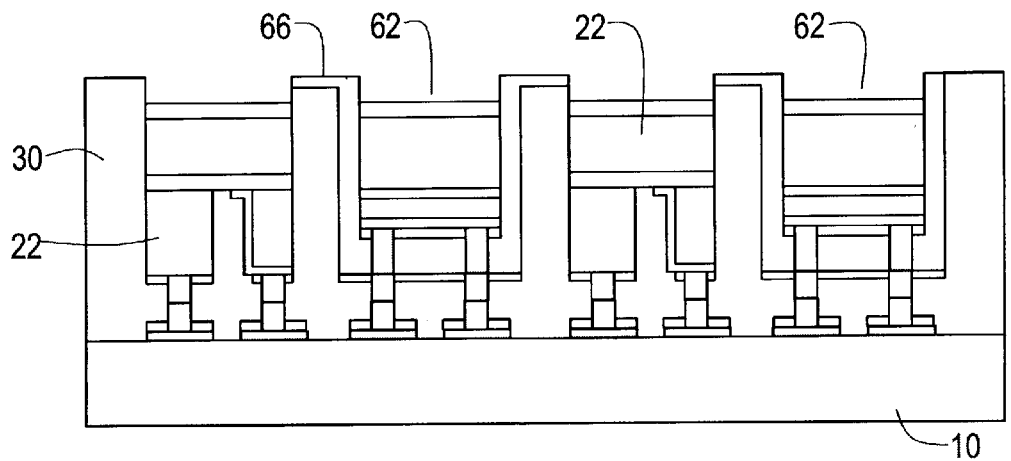
FIG. 9 is a schematic side elevational view of the optoelectronic device after removal of the second and third etch stop layers.

GaAs layer 40 is removed by selective etching and finally, etch stop layers 28 and 65 are removed by selective etching, as shown in FIG. 9. By protecting the surfaces of emitters 22 and detectors 62 with etch stop layers 28 and 65, respectively (FIG. 8), until the final processing step, contaminants, such as epoxy residue, are prevented from accumulating on the optical surfaces of the photonic devices. As such this invention results in more efficient optical transmission.

However, although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A method of making a hybrid interdigitated optoelectronic device, the method comprising:

hybridizing a first substrate and a second substrate, said second substrate including at least one first type optical device, at least one sacrificial device, said at least one first type optical device including at least first and second sacrificial layers;

introducing a first flowable hardenable material to join said first and second substrates;

curing said first flowable hardenable material;

removing said second substrate;

removing said at least one sacrificial device;

removing said first sacrificial layer;

hybridizing said first substrate and a third substrate, said third substrate including at least one second type optical device, said at least one second type optical device including at least at least a third sacrificial layer;

introducing a second flowable hardenable material to join said first and third substrates;

curing said second flowable hardenable material;

removing said third substrate; and removing said second and third sacrificial layers.

2. The method of claim 1 wherein said first substrate is a silicon CMOS substrate.

3. The method of claim 1 wherein said second and third substrates are chosen from the group of III-V compounds.

4. The method of claim 3 wherein said second and third substrates are GaAs.

5. The method of claim 4 wherein said first, second and third sacrificial layers are AlGaAs.

6. The method of claim 1 wherein said at least one first type optical device is an emitter.

7. The method of claim 1 wherein said at least one second type optical device is a detector.

* * * * *